(12) United States Patent
Bowering et al.

(10) Patent No.: US 7,394,083 B2
(45) Date of Patent: Jul. 1, 2008

(54) SYSTEMS AND METHODS FOR EUV LIGHT SOURCE METROLOGY

(75) Inventors: Norbert R. Bowering, San Diego, CA (US); Jerzy R. Hoffman, Escondido, CA (US)

(73) Assignee: Cymer, Inc., San Diego, CA (US)

( * ) Notice: Subject to any disclaimer, the term of this patent is extended or adjusted under 35 U.S.C. 154(b) by 274 days.

(21) Appl. No.: 11/177,501

(22) Filed: Jul. 8, 2005

(65) Prior Publication Data

US 2007/0008517 A1   Jan. 11, 2007

(51) Int. Cl.
*G01J 1/42* (2006.01)

(52) U.S. Cl. .............................. 250/504 R; 250/396 R; 250/493.1; 378/19; 372/5

(58) Field of Classification Search ............. 250/504 R, 250/396 R, 493.1; 378/19; 372/5
See application file for complete search history.

(56) References Cited

U.S. PATENT DOCUMENTS

| | | | |
|---|---|---|---|
| 2,759,106 A | 8/1956 | Wolter | 250/53 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,223,279 A | 9/1980 | Bradford, Jr. et al. | 331/94.5 |

(Continued)

FOREIGN PATENT DOCUMENTS

DE    10244303 A1 *   4/2004

(Continued)

OTHER PUBLICATIONS

Bollanti et al., "Compact three electrodes excimer laser iANUS for a POPA optical system," SPIE Proc. (2206) 144-153, (1994).

(Continued)

*Primary Examiner*—Jack I. Berman
*Assistant Examiner*—Michael J Logie
(74) *Attorney, Agent, or Firm*—Matthew K. Hillman

(57) ABSTRACT

Systems and methods for EUV Light Source metrology are disclosed. In a first aspect, a system for measuring an EUV light source power output may include a photoelectron source material disposed along an EUV light pathway to expose the material and generate a quantity of photoelectrons. The system may further include a detector for detecting the photoelectrons and producing an output indicative of EUV power. In another aspect, a system for measuring an EUV light intensity may include a multi-layer mirror, e.g., Mo/Si, disposable along an EUV light pathway to expose the mirror and generate a photocurrent in the mirror. A current monitor may be connected to the mirror to measure the photocurrent and produce an output indicative of EUV power. In yet another aspect, an off-line EUV metrology system may include an instrument for measuring a light characteristic and $MoSi_2/Si$ multi-layer mirror.

24 Claims, 4 Drawing Sheets

U.S. PATENT DOCUMENTS

| | | | |
|---|---|---|---|
| 4,245,160 A * | 1/1981 | Harao | 250/214 VT |
| 4,455,658 A | 6/1984 | Sutte et al. | 372/38 |
| 4,504,964 A | 3/1985 | Cartz et al. | 378/119 |
| 4,534,035 A | 8/1985 | Long | 372/85 |
| 4,536,884 A | 8/1985 | Weiss et al. | 378/119 |
| 4,538,291 A | 8/1985 | Iwamatsu | 378/119 |
| 4,550,408 A | 10/1985 | Karning et al. | 372/58 |
| 4,596,030 A | 6/1986 | Herziger et al. | 378/119 |
| 4,618,971 A | 10/1986 | Weiss et al. | 378/34 |
| 4,626,193 A | 12/1986 | Gann | 431/71 |
| 4,633,492 A | 12/1986 | Weiss et al. | 378/119 |
| 4,635,282 A | 1/1987 | Okada et al. | 378/34 |
| 4,751,723 A | 6/1988 | Gupta et al. | 378/119 |
| 4,752,946 A | 6/1988 | Gupta et al. | 378/119 |
| 4,837,794 A | 6/1989 | Riordan et al. | 378/119 |
| 4,891,820 A | 1/1990 | Rando et al. | 372/93 |
| 4,959,840 A | 9/1990 | Akins et al. | 372/57 |
| 5,005,180 A | 4/1991 | Edelman et al. | 372/57 |
| 5,023,884 A | 6/1991 | Akins et al. | 372/57 |
| 5,023,897 A | 6/1991 | Neff et al. | 387/122 |
| 5,025,445 A | 6/1991 | Anderson et al. | 372/20 |
| 5,025,446 A | 6/1991 | Kuizenga | 372/21 |
| 5,027,076 A | 6/1991 | Horsley et al. | 324/674 |
| 5,070,513 A | 12/1991 | Letardi | 372/83 |
| 5,102,776 A | 4/1992 | Hammer et al. | 430/311 |
| 5,126,638 A | 6/1992 | Dethlefsen | 315/326 |
| 5,142,166 A | 8/1992 | Birx | 307/419 |
| 5,189,678 A | 2/1993 | Ball et al. | 372/28 |
| 5,313,481 A | 5/1994 | Cook et al. | 372/37 |
| 5,315,611 A | 5/1994 | Ball et al. | 372/56 |
| 5,359,620 A | 10/1994 | Akins | 372/58 |
| 5,411,224 A | 5/1995 | Dearman et al. | 244/53 |
| 5,448,580 A | 9/1995 | Birx et al. | 372/38 |
| 5,471,965 A | 12/1995 | Kapich | 123/565 |
| 5,504,795 A | 4/1996 | McGeoch | 378/119 |
| 5,729,562 A | 3/1998 | Birx et al. | 372/38 |
| 5,763,930 A | 6/1998 | Partlo | 250/504 |
| 5,852,621 A | 12/1998 | Sandstrom | 372/25 |
| 5,856,991 A | 1/1999 | Ershov | 372/57 |
| 5,863,017 A | 1/1999 | Larson et al. | 248/176.1 |
| 5,866,871 A | 2/1999 | Birx | 219/121 |
| 5,936,988 A | 8/1999 | Partlo et al. | 372/38 |
| 5,953,360 A | 9/1999 | Vitruk et al. | 372/87 |
| 5,963,616 A | 10/1999 | Silfvast et al. | 378/122 |
| 5,978,394 A | 11/1999 | Newman et al. | 372/32 |
| 5,991,324 A | 11/1999 | Knowles et al. | 372/57 |
| 6,005,879 A | 12/1999 | Sandstrom et al. | 372/25 |
| 6,016,325 A | 1/2000 | Ness et al. | 372/38 |
| 6,018,537 A | 1/2000 | Hofmann et al. | 372/25 |
| 6,028,880 A | 2/2000 | Carlesi et al. | 372/58 |
| 6,031,241 A | 2/2000 | Silfvast et al. | 250/504 |
| 6,039,850 A | 3/2000 | Schulz | 204/192.15 |
| 6,051,841 A | 4/2000 | Partlo | 250/504 |
| 6,064,072 A | 5/2000 | Partlo et al. | 250/504 |
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,128,323 A | 10/2000 | Myers et al. | 372/38.1 |
| 6,151,346 A | 11/2000 | Partlo et al. | 372/38 |
| 6,151,349 A | 11/2000 | Gong et al. | 372/58 |
| 6,164,116 A | 12/2000 | Rice et al. | 73/1.72 |
| 6,172,324 B1 | 1/2001 | Birx | 219/121.57 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,219,368 B1 | 4/2001 | Govorkov | 372/59 |
| 6,240,117 B1 | 5/2001 | Gong et al. | 372/58 |
| 6,359,922 B1 | 3/2002 | Partlo et al. | 372/58 |
| 6,370,174 B1 | 4/2002 | Onkels et al. | 372/38.04 |
| 6,377,651 B1 * | 4/2002 | Richardson et al. | 378/34 |
| 6,381,257 B1 | 4/2002 | Ershov et al. | 372/57 |
| 6,392,743 B1 | 5/2002 | Zambon et al. | 355/69 |
| 6,404,784 B2 | 6/2002 | Komine | 372/9 |
| 6,414,979 B2 | 7/2002 | Ujazdowski et al. | 372/87 |
| 6,442,181 B1 | 8/2002 | Oliver et al. | 372/25 |
| 6,452,199 B1 | 9/2002 | Partlo et al. | 250/504 |
| 6,466,602 B1 | 10/2002 | Fleurov et al. | 372/87 |
| 6,477,193 B2 | 11/2002 | Oliver et al. | 372/58 |
| 6,493,374 B1 | 12/2002 | Fomenkov et al. | 372/102 |
| 6,529,531 B1 | 3/2003 | Everage et al. | 372/20 |
| 6,532,247 B2 | 3/2003 | Spangler et al. | 372/61 |
| 6,535,531 B1 | 3/2003 | Smith et al. | 372/25 |
| 6,538,737 B2 | 3/2003 | Sandstrom et al. | 356/334 |
| 6,541,786 B1 | 4/2003 | Partlo et al. | 250/504 |
| 6,549,551 B2 | 4/2003 | Ness et al. | 372/38.07 |
| 6,566,667 B1 | 5/2003 | Partlo et al. | 250/504 |
| 6,566,668 B2 | 5/2003 | Rauch et al. | 250/504 |
| 6,567,450 B2 | 5/2003 | Myers et al. | 372/55 |
| 6,584,132 B2 | 6/2003 | Morton | 372/57 |
| 6,586,757 B2 | 7/2003 | Melnychuk et al. | 250/504 |
| 6,621,846 B1 | 9/2003 | Sandstrom et al. | 372/57 |
| 6,625,191 B2 | 9/2003 | Knowles et al. | 372/55 |
| 6,671,294 B2 | 12/2003 | Kroyan et al. | 372/20 |
| 6,721,340 B1 | 4/2004 | Fomenkov et al. | 372/25 |
| 6,757,316 B2 | 6/2004 | Newman et al. | 372/57 |
| 6,782,031 B1 | 8/2004 | Hofmann et al. | 372/90 |
| 6,792,016 B2 * | 9/2004 | Kugler | 372/35 |
| 6,795,474 B2 | 9/2004 | Partlo et al. | 372/57 |
| 2001/0055364 A1 | 12/2001 | Kandaka et al. | 378/119 |
| 2002/0006149 A1 | 1/2002 | Spangler et al. | 372/61 |
| 2002/0012376 A1 | 1/2002 | Das et al. | 372/58 |
| 2002/0014598 A1 | 2/2002 | Melnychuk et al. | 250/504 |
| 2002/0014599 A1 | 2/2002 | Rauch et al. | 250/504 |
| 2002/0048288 A1 | 4/2002 | Kroyan et al. | 372/20 |
| 2002/0100882 A1 | 8/2002 | Partlo et al. | 250/504 |
| 2002/0101589 A1 | 8/2002 | Sandstrom et al. | 356/334 |
| 2002/0105994 A1 | 8/2002 | Partlo et al. | 372/57 |
| 2002/0114370 A1 | 8/2002 | Onkels et al. | 372/55 |
| 2002/0163313 A1 | 11/2002 | Ness et al. | 315/111.01 |
| 2002/0168049 A1 | 11/2002 | Schriever et al. | 378/119 |
| 2003/0006383 A1 | 1/2003 | Melnychuk et al. | 250/504 |
| 2003/0068012 A1 | 4/2003 | Ahmad et al. | 378/119 |
| 2003/0142280 A1 * | 7/2003 | Bakker et al. | 355/53 |
| 2004/0047385 A1 | 3/2004 | Knowles et al. | 372/55 |
| 2004/0156052 A1 * | 8/2004 | Yamamoto et al. | 356/446 |
| 2004/0253426 A1 * | 12/2004 | Yakshin et al. | 428/212 |
| 2005/0120953 A1 * | 6/2005 | Banine et al. | 118/715 |
| 2005/0230645 A1 * | 10/2005 | Melnychuk et al. | 250/504 R |
| 2005/0254154 A1 * | 11/2005 | del Puerto | 359/883 |
| 2006/0131515 A1 * | 6/2006 | Partlo et al. | 250/504 R |
| 2006/0176925 A1 * | 8/2006 | Nakano | 372/69 |
| 2006/0278833 A1 * | 12/2006 | Van Herpen et al. | 250/492.22 |
| 2007/0001130 A1 * | 1/2007 | Bykanov et al. | 250/493.1 |

FOREIGN PATENT DOCUMENTS

| | | |
|---|---|---|
| JP | 02-105478 | 4/1990 |
| JP | 03-173189 | 7/1991 |
| JP | 06-053594 | 2/1994 |
| JP | 09-219555 | 8/1997 |
| JP | 2000-058944 | 2/2000 |

OTHER PUBLICATIONS

Bollanti et al., "Ianus, the three-electrode excimer laser," App. Phys. B (Lasers & Optics) 66(4):401-406, (1998).

Choi et al., "A 1013 A/s high energy density micro discharge radiation source," B. Radiation Characteristics, p. 287-290.

Choi et al., "Fast pulsed hollow cathode capillary discharge device," Rev. of Sci. Instrum. 69(9):3118-3122 (1998).

Coutts et al., "High average power blue generation from a copper vapour laser pumped titanium sapphire laser", Journal of Modern Optics, vol. 45, No. 6, p. 1185-1197 (1998).

Fomenkov et al., "Characterizaiton of a 13.5nm source for EUV lithography based on a dense plasma focus and lithium emission," Sematech Intl. Workshop on EUV Lithography (Oct. 1999).

Hansson et al., "Xenon liquid jet laser-plasma source for EUV lithography," Emerging Lithographic Technologies IV, Proc. of SPIE, vol. 3997:729-732 (2000).

Heinzmann, "New vacuum-ultraviolet absorption data for lead vapour obtained by spin-polarisation measurements," J. Phys. B. Atom. Molec. Phys., vol. 11, No. 3, 1978.

Hercher, "Tunable single mode operation of gas lasers using intracavity tilted etalons," Applied Optics, vol. 8, No. 6, Jun. 1969, pp. 1103-1106.

Kato, "Electrode lifetimes in a plasma focus soft x-ray source," J. Appl. Phys. (33) Pt. 1, No. 8:4742-4744 (1991).

Kato et al., "Plasma focus x-ray source for lithography," Am. Vac. Sci. Tech. B., 6(1):195-198 (1988).

Lebert et al., "Soft x-ray emission of laser-produced plasmas using a low-debris cryogenic nitrogen target," J. Appl. Phys., 84(6):3419-3421 (1998).

Lebert et al., "A gas discharge based radiation source for EUV-lithography," Intl. Conf. Micro and Nano-Engineering 98 (Sep. 2-24, 1998) Leuven Belgium.

Lebert et al., "Investigation of pinch plasmas with plasma parameters promising ASE," Inst. Phys. Conf. Ser. No. 125: Section 9, pp. 411-415 (1992) Schiersee, Germany.

Lee, "Production of dense plasmas in hypocycloidal pinch apparatus," The Phys. of Fluids, 20(2):313-321 (1977).

Lewis, "Status of collision-pumped x-ray lasers," Am Inst. Phys. pp. 9-16 (1994).

Malmqvist et al., "Liquid-jet target for laser-plasma soft x-ray generation," Am. Inst. Phys. 67(12):4150-4153 (1996).

Maruyama et al., "Characteristics of high-power excimer laser master oscillator power amplifier system for dye laser pumping," Optics Communications, vol. 87, No. 3, p. 105-108 (1992).

Mather et al., "Stability of the dense plasma focus," Phys. of Fluids, 12(11):2343-2347 (1969).

Mayo et al., "A magnetized coaxial source facility for the generation of energetic plasma flows," Sci. Technol. vol. 4:pp. 47-55 (1994).

Mayo et al., "Initial results on high enthalpy plasma generation in a magnetized coaxial source," Fusion Tech vol. 26:1221-1225 (1994).

Mollenkamp et al., "A source of highly spin-polarised slow electrons based on the 'Fano Effect' on causium atoms," J. Phys. E: Sci. Instum., vol. 15, pp. 692-696, 1982.

Nilsen et al., "Analysis of resonantly photopumped Na-Ne x-ray-laser scheme," Am Phys. Soc. 44(7):4591-4597 (1991).

Partlo et al., "EUV (13.5nm) light generation using a dense plasma focus device," SPIE Proc. on Emerging Lithographic Technologies III, vol. 3676, 846-858 (Mar. 1999).

Porter et al., "Demonstration of population inversion by resonant photopumping in a neon gas cell irradiated by a sodium Z pinch," Phys. Rev. Let., 68(6):796-799, (Feb. 1992).

Price, "X-ray microscopy using grazing incidence reflection optics," Am. Inst. Phys., pp. 189-199, (1981).

Qi et al., "Fluorescence in Mg IX emission at 48.340 Å from Mg pinch plasmas photopumped by Al XI line radiation at 48.338 Å," The Am. Phys. Soc., 47(3):2253-2263 (Mar. 1993).

Richter et al., "Measurement of gigawatt radiation pulses from a vacuum and extreme ultraviolet free-electron laser," Applied Physics Letters vol. 83, No. 14, pp. 2970-2972.

Scheuer et al., "A magnetically-nozzled, quasi-steady, multimegawatt, coaxial plasma thruster," IEEE: Transactions on Plasma Science, 22(6) (Dec. 1994).

Shriever et al., "Laser-produced lithium plasma as a narrow-band extended ultraviolet radiation source for photo-electron spectroscopy," App. Optics, 37(7):1243-1248, (Mar. 1998).

Schriever et al., "Narrowband laser produced extreme ultra-violet sources adapted to silicon/molybdenum multiplayer optics," J. of App. Phys., 83(9):4566-4571, (May 1998).

Silfvast et al., "High-power plasma discharge source at 13.5 nm and 11.4 nm for EUV lithography," SPIE, vol. 3676:272-275 (Mar. 1999).

Silfvast et al., "Lithium hydride capillary discharge creates x-ray plasma at 13.5 namometers," Laser Focus World, p. 13 (Mar. 1997).

Tada et al., "1-pm spectrally narrowed compact ArF excimer laser for microlithography", Laser and Electro-Optics CLEO '96 CThG4, p. 374 (1996).

Wilhein et al., "A slit grating spectrograph for quantitative soft x-ray spectroscopy," Am. Inst. Of Phys. Rev. of Sci. Instrum, 70(3):1694-1699, (Mar. 1999).

Wu et al., "The vacuum spark and spherical pinch x-ray EUV point sources," SPIE, Conf. on Emerging Tech. III, Santa Clara, CA vol. 3676:410-420, (Mar. 1999).

Yusheng et al., "Recent Progress of "Heaven-One" high power KrF excimer laser system," Laser and Electro-Optics, CLEO '99, vol. 2, p. 302-303 (1999).

Zombeck, "Astrophysical observations with high resolution x-ray telescope," Am. Inst. Of Phys., pp. 200-209, (1981).

* cited by examiner

SYSTEMS AND METHODS FOR EUV LIGHT SOURCE METROLOGY

FIELD OF THE INVENTION

The present invention relates to metrology equipment for extreme ultraviolet ("EUV") light sources. The present invention is particularly, but not exclusively useful for measuring one of more characteristics of an EUV light stream generated by a EUV light source.

BACKGROUND OF THE INVENTION

Extreme ultraviolet ("EUV") light, e.g., electromagnetic radiation having wavelengths of around 50 nm or less, e.g., 5-50 nm, and including light at a wavelength of about 13.5 nm, can be used in lithography processes to produce extremely small features in substrates, e.g., silicon wafers.

Methods to produce EUV light include, but are not necessarily limited to, converting a material into a plasma state that has an element, e.g., xenon, lithium or tin, with an emission line in the EUV range. The plasma is typically formed in a vacuum chamber and light produced in the chamber may then be collected and directed to a focus for subsequent utilization outside of the light source chamber, e.g., for semiconductor integrated circuit manufacturing lithography.

In one such method, often termed electric discharge produced plasma ("DPP"), the plasma may be produced by an electrical discharge between a pair of electrodes. In another method, the required plasma can be produced by irradiating a target material, such as a droplet, stream or cluster of material having the required line-emitting element, with a laser beam. This later process is referred to as laser produced plasma ("LPP").

For each of these processes, the EUV light produced is typically monitored using various types of metrology equipment. This monitoring is often performed at, or downstream of a collection point, e.g., focal point, and may be conducted while the EUV light utilizing tool, e.g., lithography tool, is on-line (i.e., using light from the light source), for example, by sampling a portion of the light stream. In addition, it may be desirable to analyze most or all of the EUV light produced, for example, while the EUV light utilizing tool is off-line (i.e., not using light from the light source). Unfortunately, the lack of a practical beam splitter for EUV radiation has hindered metrology efforts thus far. Another factor that may complicate metrology efforts is the large amount of debris that may be generated by the plasma in the vacuum chamber. These undesirable by-products can include, electrons, high energy ions and scattered debris from the plasma formation, e.g., neutral atoms/molecules and/or clumps of source material that is not fully ionized in the plasma formation process.

These plasma formation by-products can potentially damage or reduce the operational efficiency of the various metrology components including, but not limited to, mirrors used to direct EUV light to a detector including multi-layer mirrors (MLM's) capable of EUV reflection at normal incidence and grazing angle incident mirrors, and the exposed surfaces of metrology detectors including filtering foils. The high energy ions and/or source material debris may be damaging to the optical elements in a number of ways, including heating them, coating them with materials which reduce light transmission, penetrating into them and, e.g., damaging structural integrity and/or optical properties, e.g., the ability of a mirror to reflect light at such short wavelengths, corroding or eroding them, diffusing into them and/or sputtering surface material.

In addition to debris, another factor that may need to be considered when measuring or directing relatively high intensity, e.g., focused, EUV light is the heat generated when the EUV light contacts a component surface. In this regard, certain multi-layer mirrors (MLM's), which may function to reflect and/or filter EUV radiation, may experience performance degradation if exposed to excessive heat.

It is to be appreciated that accessing optical elements including metrology equipment in the plasma chamber that have been contaminated or damaged by heat for the purpose of cleaning or replacing the elements can be expensive, labor intensive and time-consuming. In particular, these systems typically require a rather complicated and time consuming purging and vacuum pump-down of the plasma chamber prior to a re-start after the plasma chamber has been opened. This lengthy process can adversely affect production schedules and decrease the overall efficiency of light sources for which it is typically desirable to operate with little or no downtime.

With the above considerations in mind, Applicants disclose systems and methods for EUV light source metrology.

SUMMARY OF THE INVENTION

In a first aspect of an embodiment of the present invention, a system for measuring an EUV light source power output is disclosed. The system may include a photoelectron source material, e.g., gaseous helium or argon, disposed along an EUV light pathway to expose the source material to EUV light and generate a quantity of photoelectrons. The system may further include a detector, e.g., electron multiplier detector, channel plate detector, or vacuum photodiode for detecting the photoelectrons and producing an output indicative of EUV power. In one embodiment, the system may include a plurality of electrodes arranged to establish an electric field, e.g., an asymmetric quadrupole field, to direct photoelectrons within a selected region to a detector and prevent at least a portion of photoelectrons outside the region from reaching the detector. This structure allows for measurement of EUV light source output power at a location that may be exposed to plasma generated debris, for example, from a laser produced plasma (LPP) light source, with little or no measurement impact from the debris. The structure also allows a large portion of light from the EUV light source to pass through the measuring system for downstream use, e.g., at a lithography tool.

In another aspect of an embodiment of the present invention, a system for measuring EUV light intensity may include a multi-layer mirror, e.g., substrate coated with Mo/Si layers, disposable along an EUV light pathway to expose the mirror and generate a photocurrent in the mirror. A current monitor may be connected to the mirror to measure the photocurrent and produce an output indicative of the EUV power. In a particular embodiment, the system may include ring electrode for contacting the mirror and transferring photocurrent to the monitor. In some cases, an aperture may be positioned to shield the ring electrode from EUV light. Light reflected from the mirror can be used downstream, e.g., by a lithography tool.

In yet another aspect of an embodiment of the present invention, a metrology system for an EUV light source may include an instrument for measuring a light characteristic and at least one multi-layer mirror having at least one layer of $MoSi_2$, and at least one layer of Si. The multi-layer mirror may be moveable into a position to reflect at least a portion of a high intensity light beam from the source without thermal damage, e.g., >9 $W/cm^2$, for receipt by the instrument. In one aspect, the system may perform metrology on a light source that is used in conjunction with a lithography tool having a bandwidth reducing light path between the light source and a workpiece. In this aspect, the system may advantageously direct light to the instrument having a spectral bandwidth similar to the spectral bandwidth of light reaching the workpiece.

DETAILED DESCRIPTION OF PREFERRED EMBODIMENTS

Figure 1:
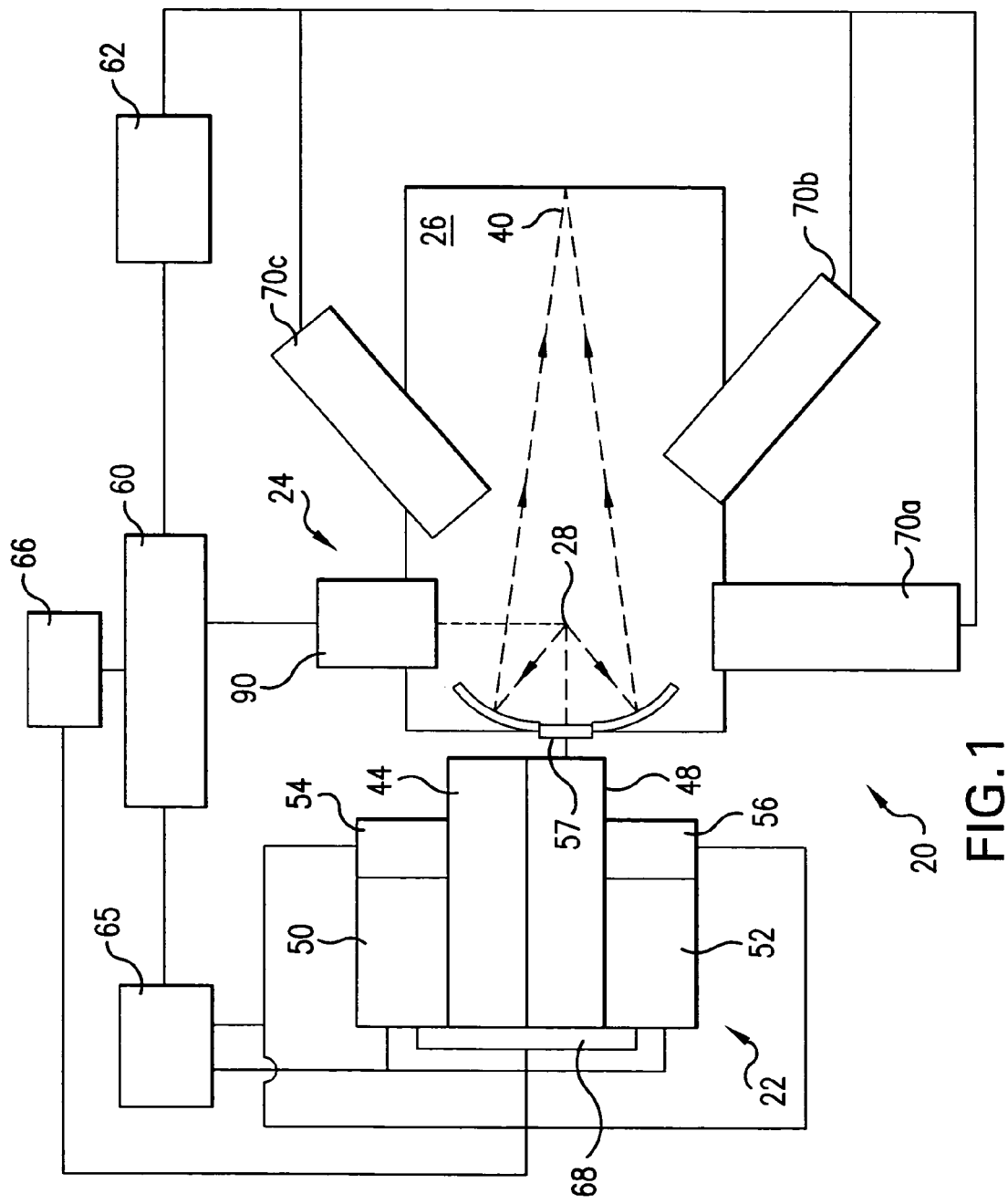
FIG. 1 shows a schematic view of an overall broad conception for a laser-produced plasma EUV light source according to an aspect of the present invention.

With initial reference to FIG. 1, there is shown a schematic view of an exemplary production EUV light source, e.g., a laser produced plasma EUV light source 20, according to an aspect of the present invention. Although aspects of the present invention are illustrated with reference to a laser produced plasma (LPP), it is to be appreciated that aspects of the present invention are equally applicable to other types of light sources which produce a plasma including an electric discharge produced plasma ("DPP"), a representative construction of which is disclosed in co-owned U.S. Pat. No. 6,815,700, which is hereby incorporated by reference herein.

Continuing with FIG. 1, an LPP light source 20 may contain a pulsed laser system 22, e.g., a $CO_2$, gas discharge excimer, or molecular fluorine laser operating at high power and high pulse repetition rate and may be a MOPA configured laser system, e.g., as shown in U.S. Pat. Nos. 6,625,191, 6,549,551, and 6,567,450. The light source 20 may also include a target delivery system 24, e.g., delivering targets in the form of liquid droplets, a liquid stream, solid particles or clusters, solid particles contained within liquid droplets or solid particles contained within a liquid stream. The targets may be delivered by the target delivery system 24, e.g., into the interior of a chamber 26 to a plasma formation site 28.

Laser pulses may be delivered from the pulsed laser system 22 along a laser optical axis through a laser input window 57 and into the chamber 26 to the irradiation site, suitably focused, to create a plasma, having certain characteristics which depend on the source material of the target. These characteristics may include the wavelength of the EUV light produced and the type and amount of debris released from the plasma during and/or after plasma formation.

The light source may also include a collector 30, e.g., a reflector, e.g., in the form of a truncated ellipse, with an aperture to allow the laser light to pass through and reach the formation site 28. The collector 30 may be, e.g., an elliptical mirror that has a first focus at the formation site 28 and a second focus at a so-called intermediate point 40 (also called the intermediate focus 40) where the EUV light may be output from the light source and input to, e.g., an integrated circuit lithography tool (not shown).

The pulsed system 22 may include a dual chamber, e.g., a master oscillator-power amplifier ("MOPA"), gas discharge laser system having, e.g., an oscillator laser system 44 and an amplifier laser system 48, with, e.g., a magnetic reactor-switched pulse compression and timing circuit 50 for the oscillator laser system 44 and a magnetic reactor-switched pulse compression and timing circuit 52 for the amplifier laser system 48, along with a pulse power timing monitoring system 54 for the oscillator laser system 44 and a pulse power timing monitoring system 56 for the amplifier laser system 48. The system 20 may also include an EUV light source controller system 60, which may also include, e.g., a target position detection feedback system 62 and a firing control system 65, along with, e.g., a laser beam positioning system 66.

The system 20 may also include a target position detection system which may include one or more droplet imagers 70a-c that provide an output indicative of the position of a target droplet, e.g., relative to the ignition site and provide this output to the target position detection feedback system, which can, e.g., compute a target position and trajectory, from which a target error can be computed, if not on a droplet by droplet basis then on average. The target error may then be provided as an input to the system controller 60, which can, e.g., provide a laser position, direction and timing correction signal, e.g., to the laser beam positioning system 66 that the laser beam positioning system can use, e.g., to control the laser timing circuit and/or to control the laser position and direction changer 68, e.g., to change the focus point of the laser beam to a different ignition point 28.

The target delivery control system 90, in response to a signal from the system controller 60 may, e.g., modify the release point of the target droplets as released by a target delivery mechanism to correct for errors in the target droplets arriving at the desired ignition site 28. An EUV light source detector (not shown) may also provide feedback to the system controller 60 that can be, e.g., indicative of the errors in such things as the timing and focus of the laser pulses to properly intercept the target droplets in the right place and time for effective and efficient EUV light production.

Figure 2:
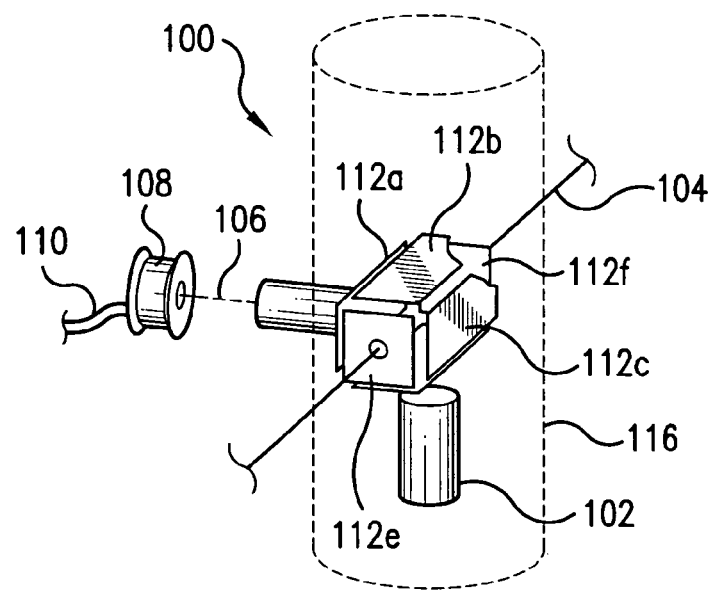
FIG. 2 shows a perspective view illustrating an aspect of an embodiment of the present invention wherein photoelectrons are generated and measured to determine an EUV light source output power, shown after removal of top and side electrode portions to reveal the rear electrode.
Figure 3:
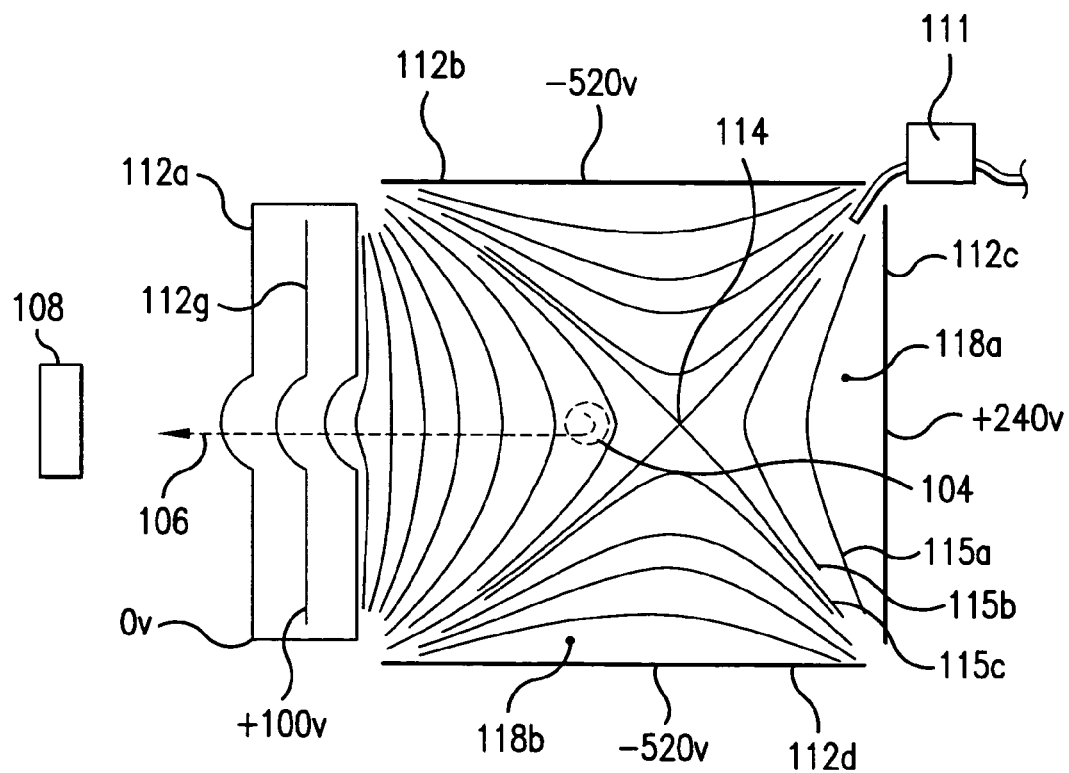
FIG. 3 shows a sectional view illustrating an electric field arrangement for directing photoelectrons to a detector.

With reference now to FIGS. 2 and 3, a system 100 is shown for measuring light power produced by a light source, such as the light source 20 shown in FIG. 1. The system 100 may be positioned to measure light power at the intermediate focus 40 and/or upstream of the intermediate focus. Alternatively, or in addition thereto, the system may be positioned to measure light power downstream of the intermediate focus 40, e.g., at the scanner tool (not shown). As shown in FIG. 2, the system 100 may include a supply 102 of a photoelectron source material, e.g., gaseous helium, argon, hydrogen, deuterium and/or one or more other rare gases, that may be positioned to establish a gas presence along an EUV light pathway 104, to expose the source material to EUV light. In some cases, a gaseous source material at a relatively low pressure, e.g., in the milli-Torr range, may be used. With this arrangement, only a small portion of the incident EUV light may be absorbed by the source material, allowing for subsequent use of a relatively large portion of the EUV light, e.g., at a lithography tool. In some cases, the photoelectron source material may already be present, e.g., as a background gas, at the desired measurement location, and thus, additional source material may not need to be supplied for photoelectron generation. For example, a buffer gas may be employed in the plasma chamber to deflect or slow plasma produced ions to prevent the ions from damaging internal components. In this case, the buffer gas may also serve as the source material.

The interaction between EUV light and the source material may then generate a quantity of photoelectrons, with the quantity of photoelectrons 106 being indicative of EUV power. As shown, the photoelectrons 106 may be directed to a detector 108 which outputs an electrical signal 110 indicative of EUV light power. For example, the detector 108 may be an electron multiplier detector, a channel plate detector or a vacuum photodiode. In some cases, electron pulses can be detected with amplification (for example, by using an electron multiplier detector) for pulsed EUV light that is pulsed at relatively high repetition rates, e.g., several kHz. Typically, the electron signal may decay fast enough (on a microsecond time scale) such that when the next EUV light pulse arrives, there will be only a small background signal due to some scattered electrons or electrons produced by ion impact. This background can then be subtracted from the pulse signal. For some implementations, the source gas may be selected to have a relatively high ionization threshold such that photoelectrons will only be generated by EUV radiation and not by deep UV, visible or infrared radiation.

For the system shown in FIG. 1, light may be directed to the intermediate focus 40 after reflection by the collector mirror 30 that may be a multi-layer coated normal incidence mirror. With this arrangement, light reaching the intermediate focus 40 may be predominantly in-band EUV radiation. Alternatively, a grazing incidence mirror arrangement with subsequent spectral purity filter may be used, e.g., in a DPP source, to direct predominantly in-band EUV radiation to an intermediate focus. For these situations, a photoelectron-based system 100 detects in-band EUV radiation. In some cases, other EUV radiation (other than in-band) may also present at the IF (as, for example, in the case of a grazing incidence collection scheme without spectral purity filter). For this case, the photoelectrons generated by in-band EUV radiation may be isolated from the remaining photoelectrons using e.g., electron energy filtering (i.e., electron spectroscopy).

The EUV radiation energy corresponding to 13.5 nm wavelength, corresponding to an energy of about 92 eV, may be high enough to produce more than one photoelectron from a gas atom (i.e., double-ionization is possible, for example). However, the system 10 may still output a useful signal indicative of EUV light power because only a relative signal may be necessary to monitor changes of EUV output power at the intermediate focus.

The gas pressure can be measured by a gas monitor 111, as shown in FIG. 3. With this measurement, the detected photoelectron signal can then be normalized to the gas pressure to eliminate signal variations due to the gas pressure. Alternatively, or in addition thereto, the gas pressure can be input into a control loop together with the supply 102 (shown in FIG. 2) to control gas pressure within a preselected range.

FIGS. 2 and 3 show an arrangement of charged electrodes 112a-g that may be used to deflect photoelectrons to the detector 110. Note: rear portions of electrodes 112b and 112c have been broken away in FIG. 2 to reveal electrode 112f. As provided in more detail below, the arrangement of independently charged electrodes shown may limit the photoelectrons which ultimately reach the detector 108 to those photoelectrons that are generated at (or are present near) the location where the EUV light interacts with the photoelectron source material. As shown, each electrode 112a-g may be independently charged (charging circuit(s) not shown) to establish an asymmetric quadrupole field arrangement having a saddle 114. As shown, suitable electrode voltages to establish the asymmetric quadrupole field may be: electrode 112a=0V, electrode 112g=+100V, electrode 112c=+240V and electrode 112b=electrode 112d=electrode 112e=electrode 112f=−520V. Exemplary equipotential field lines are shown with representative lines 115a-c labeled. Other electrode voltage combinations are possible. As shown, the light pathway 104 (where photoelectrons are generated by the interaction between the source material and the EUV light) may be positioned between the saddle 114 and detector 108.

For the field arrangement shown in FIG. 3, positive ions may be drawn towards the negatively charged plates and captured there. Secondary photoelectrons generated in regions outside of the light pathway 104 (at the negatively charged field plates, for example) typically have insufficient energies to reach the detector. For example, photoelectrons at location 118a typically have insufficient energy to surmount the saddle and reach the detector 108. Also, photoelectrons at location 118b typically have insufficient energy to overcome the strength of the field and reach the detector 108. Instead, the field places these photoelectrons on trajectories which miss the detector 108. Further information regarding the quadrupole arrangement may be found in R. Möllenkamp and U. Heinzmann, J. Phys. E 15, 692 (1982), and U. Heinzmann, J. Phys. B 11, 399 (1978). In some cases, all photoelectrons generated at/near the light pathway 104 may not be detected. However, for these cases, an output signal that is proportionate to, and thus indicative of, EUV light power may still result.

FIG. 2 further illustrates that portions or all of the system 100 may be shielded from stray magnetic fields which may adversely affect photoelectron deflection. These stray magnetic fields may arise from steel system components, the earth's magnetic field and/or other sources. To minimize the effects of stray magnetic fields, the system 100 may include an enclosure 116 made of a material having a relatively high magnetic permeability, μ. For example, materials commonly known as Mu-metals may be used, to include nickel-iron alloys such as 77% nickel, 15% iron, and varying amounts of copper and molybdenum.

In addition to or instead of photoelectrons, other forms of energy, e.g., energy beams, light, energized particles, etc, may be generated via interaction between a suitable source material and EUV radiation and used to measure EUV light power. These other energy beams may include, but are not necessarily limited to, fluorescent light, ions, and any other particle and/or light emission, known in the art, that may be generated by an interaction between a material and EUV light. Moreover, the source material does not necessarily need to be in a gaseous state. These other energy forms may be measured using an appropriate detector (e.g., CCD array, Faraday cup, etc), and used to provide an indication of EUV light power. In some cases, it may be advantageous to detect the photoelectrons rather than ions, since the photoelectrons may be lighter, faster and easier to deflect than ions.

Figure 4:
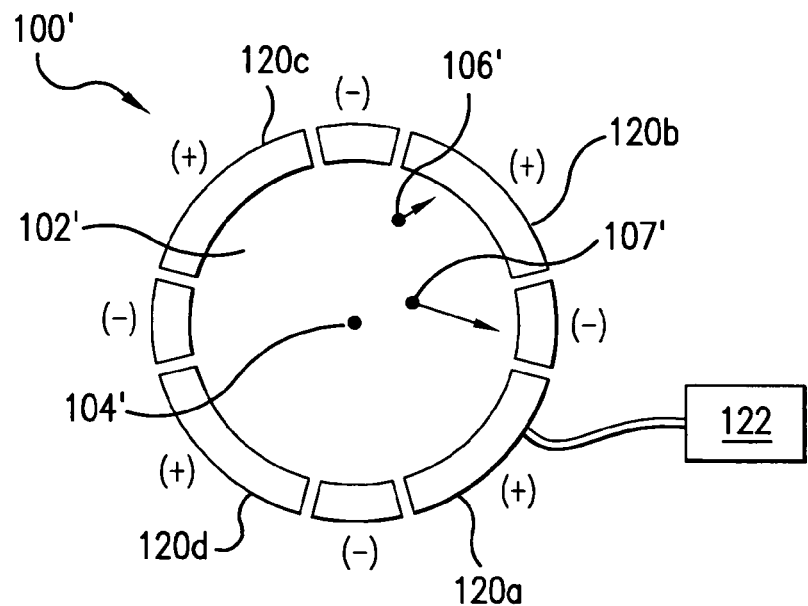
FIG. 4 shows a sectional view illustrating another aspect of an embodiment of the present invention wherein charged particles are generated by the interaction between a source material and EUV light and measured to determine an EUV light source output power.

FIG. 4 shows an aspect of another embodiment of the present invention, designated generally system 100', for measuring light power produced by a light source, such as the light source 20 shown in FIG. 1. As shown in FIG. 4, the system 100' may include a supply 102' of a source material, e.g., gaseous helium, argon, hydrogen, deuterium and/or one or more other rare gases, that may be positioned to establish a gas presence along an EUV light pathway 104', to expose the source material to EUV light.

The interaction between EUV light and the source material may then generate a quantity of photoelectrons, with the quantity of photoelectrons 106' being indicative of EUV power. Also, a quantity of ions 107' may be generated by the interaction between EUV light and the source material, with the quantity of ions 107' being indicative of EUV power. The system 100' may further include a detecting system consisting of a plurality of positive electrodes 120*a-d*, e.g., charged to a voltage of 10-30V, and a voltage meter 122. Photoelectrons 106' generated by the interaction between EUV light and the source material may be attracted to and reach the positive electrodes 120*a-d* and register a voltage at the meter 122 indicative of EUV light power. Alternatively, a plurality of negative electrodes 124*a-d*, e.g., charged to a voltage of 10-30V, may be connected to a voltage meter to measure ions 107' generated by the interaction between EUV light and the source material, again, with the meter output being indicative of EUV light power. Advantageously, a large portion of the light entering systems 100, 100' is unaffected in the systems 100, 100' and can be used downstream, e.g., at a lithography tool.

Figure 5:
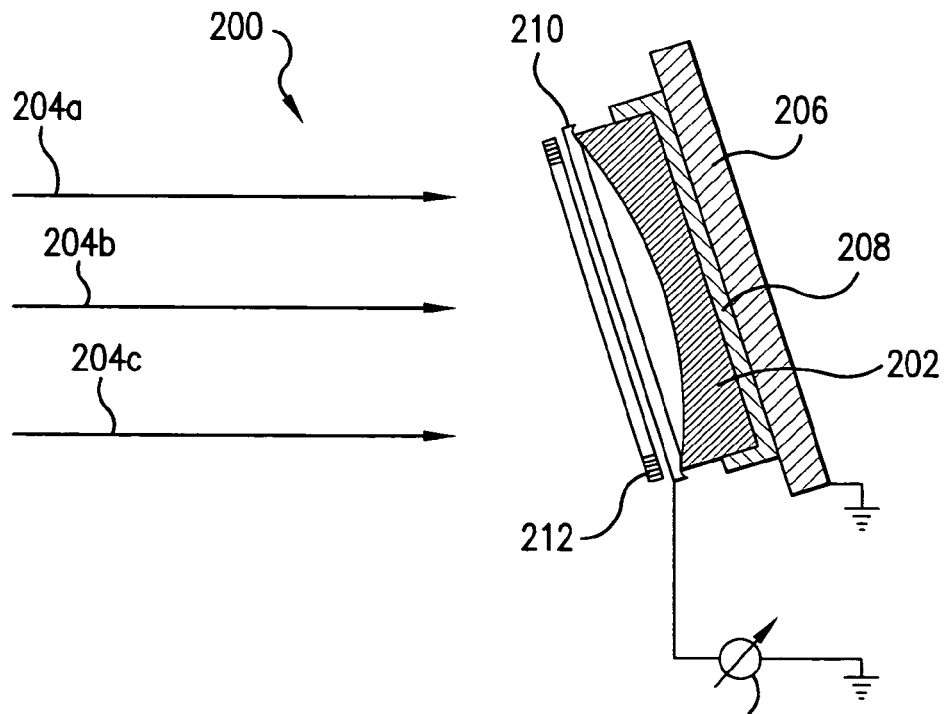
FIG. 5 shows a sectional view (with peripheral components shown schematically) illustrating an aspect of an embodiment of the present invention wherein a photocurrent generated in a multi-layer mirror may be measured to determine EUV light intensity.

FIG. 5 shows an aspect of another embodiment of the present invention, designated generally system 200, wherein a photocurrent that is generated in a multi-layer mirror 202 may be measured to determine the intensity of EUV light (illustrated by exemplary rays 204*a-c*) incident upon the mirror 202. In more structural detail, the system 200 may include a multi-layer mirror, e.g., a mirror having a plurality of alternating layers such as Mo alternating with Si. As shown, the mirror 202 may be attached to a grounded base plate 206 and an insulator 208 may be interposed between the mirror 202 and base plate 206 to electrically isolate the mirror 202 from ground. In one embodiment, the insulator 208 may be made of a ceramic material. FIG. 5 further shows that the system 200 may include a ring electrode 210 made of a conductive material which may be placed in electrical contact with the outer edge of the mirror 202, as shown. An aperture 212 may be positioned to shield the ring electrode 210 from EUV light. For the system 10, a current monitor 214 may be electrically connected to the ring electrode 210. For example, a sensitive current monitor such as a pico-ampere meter or other pulseds current detection instrument known in the art may be used.

In use, the mirror 202 may be positioned along an EUV light pathway to expose the mirror and generate a photocurrent in the mirror 202. The photocurrent then passes through the ring electrode 210 and reaches the current monitor 214. The current monitor 214 then produces an output indicative of EUV power. The system 200 can be used to somewhat easily adapt multi-layer mirrors that are already present in an optical system such as an EUV light source or lithography tool, including mirrors used to direct and/or filter EUV light into light intensity monitors. Advantageously, a large portion of the light entering system 200 is unaffected in system 200 and can be used downstream, e.g., at a lithography tool.

Figure 6:
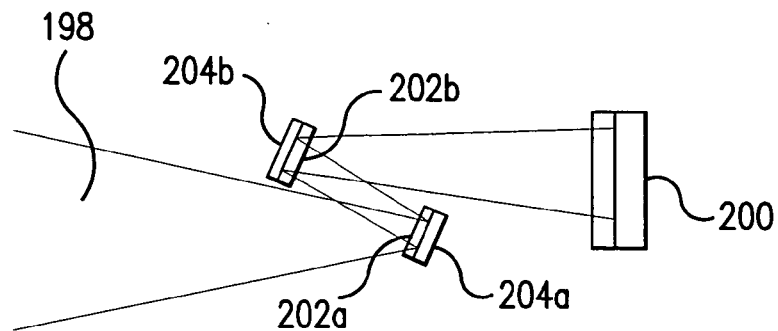
FIG. 6 illustrates an optical arrangement having a pair of back-cooled multi-layer mirrors for directing relatively high intensity EUV light to a detector.

FIG. 6 shows a system for directing relatively high average intensity EUV light 198 (e.g., >9 W/cm$^2$) to a metrology detector 200. As shown, the system may include a pair of back-cooled multi-layer mirrors 202*a,b* positioned along a beam path to direct light to the detector 200. For example, the mirrors 202*a,b* may be positioned at a 5° angle of incidence (corresponding to a 85° grazing angle) in a "zigzag arrangement" in front of, for example, an EUV detector 200. Although two mirrors 202 are shown, it is to be appreciated that more than two and as few as one mirror 202 may be used to direct relatively high intensity EUV light 198 to the metrology detector 200. In one application, the system may be used to direct light from a position at or near the intermediate focus 40 (see FIG. 1) to the detector 200. For some light sources, the light at the intermediate focus 40 (see FIG. 1) may have an average intensity greater than 9 W/cm$^2$, e.g., 9-11 W/cm$^2$, and as a consequence, may, in some cases degrade a standard, MoSi multi-layer mirror (MLM).

For pulsed radiation, the average intensity is equal to the average pulse energy multiplied by the pulse repetition rate divided by the exposed area. For the directing system, the mirrors 202*a,b* may each be an MLM having at least one layer of MoSi$_2$, and at least one layer of Si. In one exemplary embodiment, each mirror 202*a,b* may include more than 50 bi-layers, e.g., between 60 and 80 bi-layers or more, with each bi-layer having a layer of MoSi$_2$ and a layer of Si. It is to be appreciated that other types of layers, e.g., diffusion barriers, and protective coatings may be incorporated in the mirrors 202*a,b*. With the MoSi$_2$/Si structure, the mirrors 202*a,b* may withstand temperatures up to ~600° C. with little or no degradation. Moreover, as shown in FIG. 5, a cooling sub-system 204*a,b* may be mounted on the non-reflecting side of each respective mirror 202*a,b*. For example, each cooling sub-system 204*a,b* may include a water-cooled copper plate.

In one implementation, one or both of the mirrors 202*a,b* may be moveable from a first position (not shown) in which the light source is "on-line" and most or all of the light 198 passes through the system for downstream use without contacting the mirrors 202*a,b* to a second "off-line" position (shown in FIG. 5) in which most or all of the light 198 is directed by the mirrors 202*a,b* to the detector 200. For example, when the source is on-line, light 198 may be directed to a lithography tool.

In one aspect of the invention, the system shown in FIG. 5 can be used to limit the EUV light reaching the detector 200 to light having a spectral bandwidth of about 2% to simulate the spectral bandwidth of EUV light expected at the wafer plane of a downstream lithography tool. In more detail, from the intermediate focus 40 shown in FIG. 1, EUV light generated by the source may be reflected by typical MoSi MLM's approximately 8-10 times within the lithography tool (not shown). Each reflection from a MoSi MLM may affect the bandwidth of the reflected light. Thus, the lithography tool may establish a bandwidth reducing light path between the light source and a workpiece (e.g., wafer plane).

Figure 7:
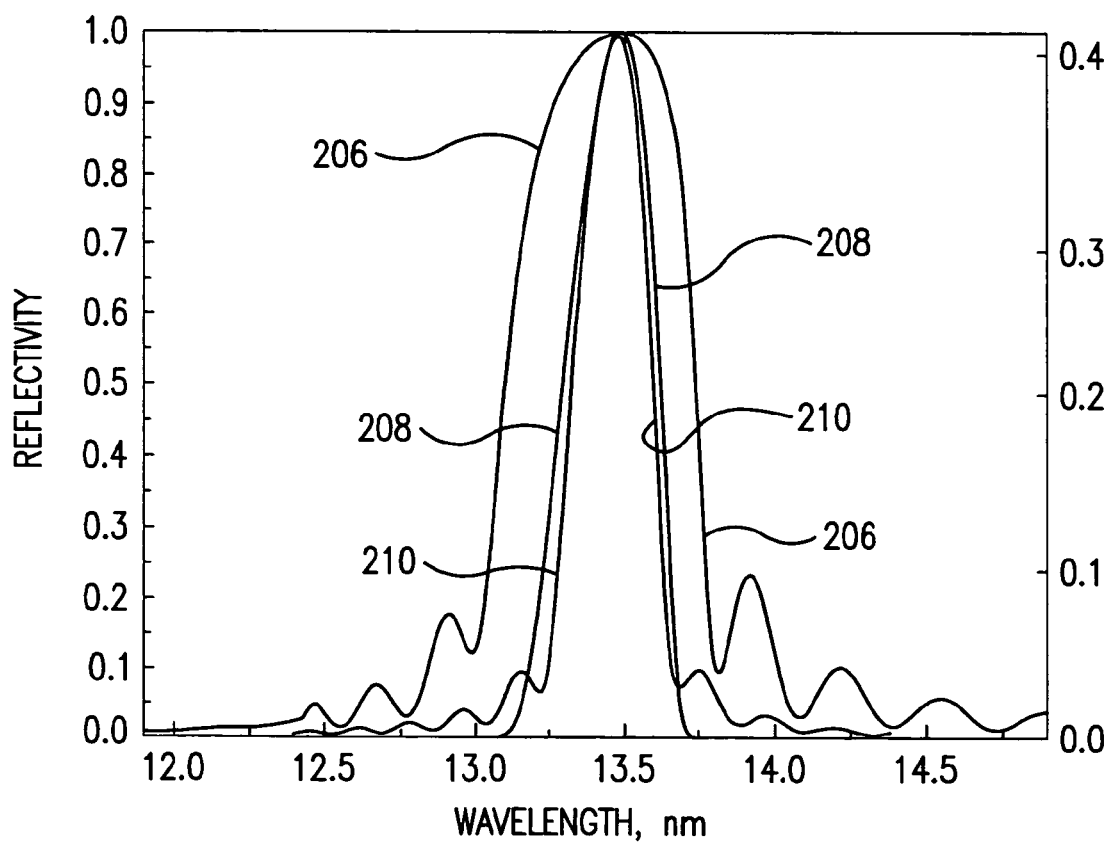
FIG. 7 shows a calculated plot of reflectivity versus wavelength for a single reflection from a $MoSi_2$/Si multi-layer mirror, a plot of reflectivity versus wavelength for a single reflection from a Mo/Si multi-layer mirror and a plot of reflectivity versus wavelength for 10 reflections from a Mo/Si multi-layer mirror.

FIG. 7 shows a calculated plot 206 of reflectivity versus wavelength for a single reflection from a Mo/Si multi-layer mirror. As shown, the reflection has a peak at about 13.5 nm and a full-width half max (FWHM) bandwidth of about 5%, e.g., 0.6-0.7 nm. On the other hand, plot 208 illustrates the effect of 10 reflections from a Mo/Si multi-layer mirror. As shown, the 10 reflections result in a light beam having a peak at about 13.5 nm and a FWHM bandwidth of about 2%, e.g., 0.27 nm. Plot 210 in FIG. 7 illustrates the effect of a single reflection from a MoSi$_2$/Si multi-layer mirror, e.g., mirror 202*a*. Specifically, plot 210 corresponds to a MoSi$_2$/Si MLM having about N=60 to N=80 bi-layers. This corresponds to the number of bi-layers, where the MoSi$_2$/Si MLMs have close to their optimal reflectivity at near normal incidence. A MoSi$_2$/Si MLM having a peak reflectivity of about R ~45%, e.g., providing sufficient light for metrology tools and imaging, may have Si as top layer, a MoSi$_2$ density of 5.8 g/ccm, a period of 6.857 nm, a Gamma ratio of 0.45, a sigma layer roughness of 0.4 nm, a polarization of 0 (i.e., unpolarized), and an angle of incidence 85°, e.g., grazing angle.

It can be seen from FIG. 7 that plot 210 is somewhat similar to plot 208, having a peak at about 13.5 nm and a FWHM bandwidth of slightly less than 2%, e.g., 0.25 nm. The implication of this similarity is that the $MoSi_2$/Si multi-layer mirror, e.g., mirror 202a can be used to direct light to a detector having a bandwidth, e.g., about 2%, which is close to the bandwidth of the light exiting the lithography tool and interacting with the wafer (i.e., light reflected 8-10 times from Mo/Si MLM's). In one implementation, the $MoSi_2$/Si MLM system may be arranged to reduce the sampled light's bandwidth to within ±10% of the bandwidth of the light exiting the light path of the lithography tool, e.g., reduced to less than about 0.30 nm.

While the particular aspects of embodiment(s) described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the present invention are merely exemplary, illustrative and representative of the subject matter which is broadly contemplated by the present invention. The scope of the presently described and claimed aspects of embodiments fully encompasses other embodiments which may now be or may become obvious to those skilled in the art based on the teachings of the Specification. The scope of the present systems and methods for EUV light source metrology are solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art.

We claim:

1. An EUV light source having a system for measuring power output, said light source comprising:
    a chamber;
    a means for producing an EUV light emitting plasma at a plasma site within the chamber, the plasma generating plasma produced ions;
    a buffer gas disposed within the chamber to slow the plasma produced ions;
    a photoelectron source material disposable in the chamber and along an EUV light pathway to expose said source material to EUV light and generate a quantity of photoelectrons, said quantity of photoelectrons being indicative of EUV power, the photoelectron source material and buffer gas comprised of the same material; and
    a detector for detecting said photoelectrons and producing an output indicative of said EUV power.

2. A light source as recited in claim 1 wherein said system further comprises a plurality of electrodes arranged to establish an electric field to direct photoelectrons within a selected region to said detector and prevent at least a portion of photoelectrons outside said region from reaching said detector.

3. A light source as recited in claim 2 wherein said electric field is an asymmetric quadrupole.

4. A light source as recited in claim 2 wherein said region is at least partially enclosed by a shield having a relatively high magnetic permeability to reduce a magnetic field strength in said region.

5. A light source as recited in claim 2 wherein said shield comprises mu metal.

6. A light source as recited in claim 3 wherein said quadrupole defines a saddle and said region is positioned between said saddle and said detector.

7. A light source as recited in claim 1 wherein said photoelectron. source material is a gas selected from the group of gases consisting of hydrogen, deuterium and combinations thereof.

8. A light source as recited in claim 7 wherein said source material is a gas at a pressure in the mnilli-ton range.

9. A light source as recited in claim 1 wherein said wherein said photoelectron source material is a gas and said system further comprises a gas monitor to measure an amount of gas exposed to said EUV light.

10. A light source as recited in claim 9 wherein said system further comprises a control system to maintain the amount of gas exposed to said EUV light at a preselected level.

11. A light source as recited in claim 1 wherein said EUV light source generates debris at the plasma site and said system measures EUV light source output power at a location exposed to said debris.

12. A light source as recited in claim 1 wherein said detector is an electron multiplier detector.

13. A light source as recited in claim 1 wherein said detector is a channel plate detector.

14. A light source as recited in claim 1 wherein said detector is a vacuum photodiode.

15. A system for measuring an EUV light source power output, said system comprising: a gaseous source material disposable along an EUV light pathway to expose said gaseous source material to EUV light and generate an energy form, said energy form being indicative of EUV power; and a detector for measuring a characteristic of said energy form and producing an output indicative of said EUV power; and wherein the EUV light source generates debris at a plasma site and said system measures EUV light source output power at a location exposed to said debris.

16. A system as recited in claim 15 wherein a gas and said system further comprises a gas monitor to measure an amount of gas exposed to said EUV light.

17. A system as recited in claim 15 wherein said energy form comprises fluorescent light.

18. A system as recited in claim 15 wherein said energy form comprises photoelectrons.

19. A system for measuring an EUV light intensity, said system comprising:
   a multi-layer mirror disposable along an EUV light pathway to expose said mirror to EUV light and generate photocurrent in said mirror;
   a current monitor connected to said mirror to measure said photocurrent and produce an output indicative of said EUV light intensity.

20. A system as recited in claim 19 wherein said mirror comprises at least one layer of Mo and at least one layer of Si.

21. A system as recited in claim 19 wherein said system further comprises a grounded base plate and an insulator interposed between said mirror and said base plate.

22. A system as recited in claim 21 wherein said insulator comprises a ceramic material.

23. A system as recited in claim 19 wherein said system further comprises a ring electrode for contacting said mirror and transferring said photocurrent to said monitor.

24. A system as recited in claim 23 wherein said system further comprises an aperture positioned to shield said ring electrode from EUV light.

* * * * *

UNITED STATES PATENT AND TRADEMARK OFFICE
CERTIFICATE OF CORRECTION

| | |
|---|---|
| PATENT NO. | : 7,394,083 B2 |
| APPLICATION NO. | : 11/177501 |
| DATED | : July 1, 2008 |
| INVENTOR(S) | : Norbert R. Bowering et al. |

It is certified that error appears in the above-identified patent and that said Letters Patent is hereby corrected as shown below:

Column 11:
Line 3, after "wherein" delete "a gas and".

Signed and Sealed this

Second Day of September, 2008

JON W. DUDAS
*Director of the United States Patent and Trademark Office*